United States Patent [19]
Bainbridge et al.

[11] Patent Number: 6,123,266
[45] Date of Patent: Sep. 26, 2000

[54] COOLING SYSTEM FOR STAND-ALONE BATTERY CABINETS

[75] Inventors: Gary Dean Bainbridge, Sparta; Carla Betro, Rockaway; Mayankkumar M. Dixit, Bridgewater; Quang Duong, Denville; Mahesh B. Mistry, Parsippany; Stephen John Palaszewski, Chester; Chandrakant B. Patel, Lakewood, all of N.J.

[73] Assignee: Lucent Technologies Inc., Murray Hill, N.J.

[21] Appl. No.: 08/892,255

[22] Filed: Jul. 11, 1997

[51] Int. Cl.[7] ................................................. F25D 23/12
[52] U.S. Cl. ..................... 236/49.3; 62/259.3; 165/80.3; 429/120
[58] Field of Search ............................. 236/49.3, 91 E; 454/184; 165/104.33, 104.34, 80.3; 429/120; 62/259.2

[56] References Cited

U.S. PATENT DOCUMENTS

| | | | |
|---|---|---|---|
| 2,167,472 | 7/1939 | Bedford | 236/49.3 |
| 2,488,518 | 11/1949 | Zucker | 236/91 E |
| 4,251,026 | 2/1981 | Siegel et al. | 236/46 R |
| 4,443,524 | 4/1984 | Meinhold | 429/120 |
| 5,484,012 | 1/1996 | Hiratsuka | 165/80.3 |
| 5,570,740 | 11/1996 | Flores et al. | 165/104.34 |
| 5,585,205 | 12/1996 | Kohchi | 429/120 |
| 5,860,291 | 1/1999 | Johnson et al. | 62/259.2 |

*Primary Examiner*—William E. Tapoical
*Attorney, Agent, or Firm*—Wendy W. Koba

[57] ABSTRACT

An outdoor battery cabinet is formed to include a cooling system to extend the life of the housed batteries. The cooling system comprises a ventilation system including an air intake unit, an exhaust unit and a thermostat control. The interior surface of the cabinet is covered with a layer of insulative material. The ventilation system is configured to turn "on" when the outdoor temperature drops below the interior cabinet temperature, thereby cooling the housed batteries. Once the outdoor temperature rises above the cabinet temperature, the ventilation system is turned "off" and the insulation in the cabinet functions to maintain the cooler ambient temperature within the cabinet. To minimize the effects of wind forcing air through the ventilation openings, the intake and exhaust louvers are located on the same side of the cabinet.

6 Claims, 2 Drawing Sheets

6,123,266

COOLING SYSTEM FOR STAND-ALONE BATTERY CABINETS

BACKGROUND OF THE INVENTION

1. Technical Field

The present invention relates to a cooling system for a stand-alone battery cabinet or a battery compartment within a larger cabinet and, more particularly, to a system that minimizes the battery temperature and thus extends the life of the battery.

2. Description of the Prior Art

Telecommunications equipment housed in outdoor enclosures frequently includes batteries that are used as a back-up source of power in case of a utility power failure. Batteries in such an environment are heated above the outdoor air temperature by the effects of the sun and internal heat generation associated with the batteries themselves. The service life of the batteries is a strong function of temperature. In particular, the life decreases exponentially as the average battery temperature rises above 25° C.

One solution to this problem is to provide air conditioning units with the battery cabinet. However, this approach requires a significant amount of power and has a relatively high operating cost. Also, the air conditioning unit itself is rather complex and requires many additional components to be used in association with the battery unit. Also, batteries are known to generate hydrogen as they are used. The air conditioning system should therefore be modified to include an auxiliary ventilation system that will dissipate the hydrogen. The auxiliary ventilation system appears as a load to the air conditioning system, thus requiring an oversized unit with respect to the batteries.

Thus, a need remains in the prior art for a simpler and more cost effective system for cooling batteries used in outdoor enclosures.

SUMMARY OF THE INVENTION

The need remaining in the prior art is addressed by the present invention, which relates to a cooling system for a stand-alone battery cabinet and, more particularly, to a system that minimizes the battery temperature and thus extends the life of the battery.

In accordance with the teachings of the present invention, a battery cabinet is configured to include a ventilation system formed of an air intake unit and an air exhaust unit The cabinet further includes insulation disposed to surround the inner wall surfaces of the cabinet. A thermostat may be used to control the ventilation system such that the intake and exhaust units are activated whenever the outdoor temperature is less than the cabinet interior temperature. As the outdoor temperature rises above the cabinet temperature, the ventilation system is turned "off", and the insulation functions to maintain the cooler temperature inside the cabinet.

The location of both the intake and exhaust areas on the same side of the cabinet reduces the effect of wind forcing air through the ventilation openings, thereby minimizing the air flow between the two openings.

Other and further features of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
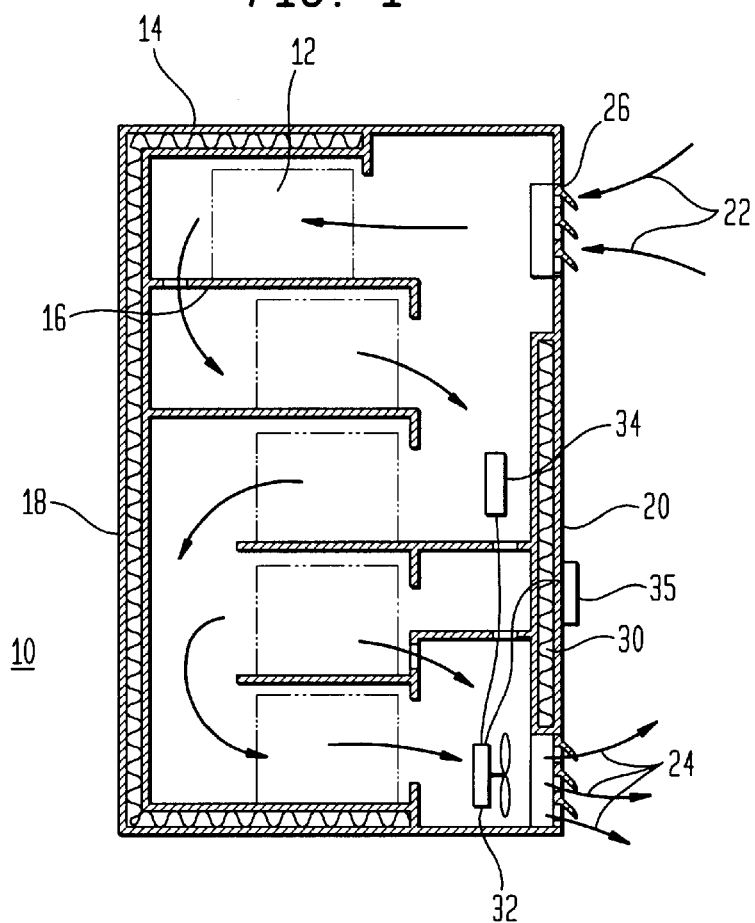
FIG. 1 contains a cut-away side view of an exemplary battery cabinet including the cooling system of the present invention.
Figure 2:
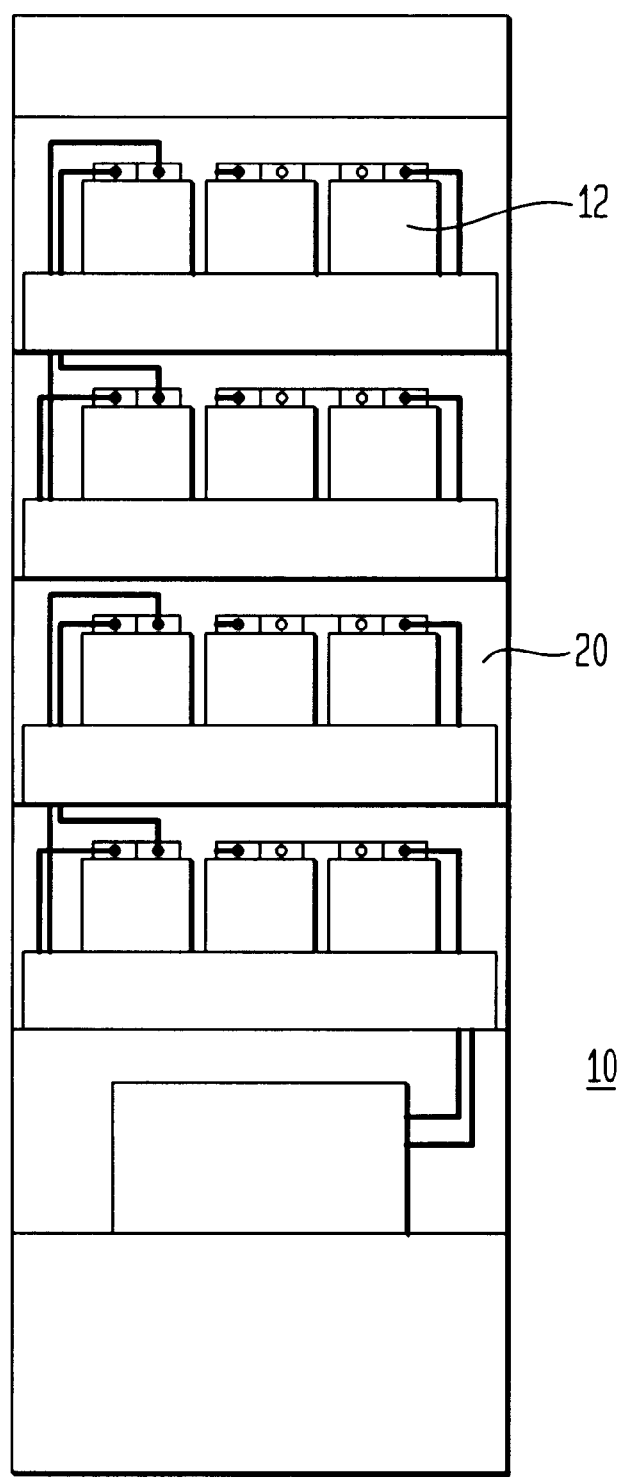
FIG. 2 is an interior view of the rear of the cabinet of FIG. 1.

An exemplary cooled battery cabinet 10 of the present invention is illustrated in FIG. 1. In this cut-away side view, only a single column 12 of batteries is shown. It is to be understood that a typical battery cabinet may include any number of batteries on each row, where the rear view illustration of FIG. 2 shows four such batteries in each row. Cabinet 10 includes, referring back to FIG. 1, insulation 14 (such as, for example conventional building insulation) attached to the complete inside wall surface of cabinet 10. As shown, insulation 14 is attached to the top surface and the bottom surface, as well as the side walls of cabinet 10. Cabinet 10 may be either a stand-alone battery cabinet or a battery compartment within a larger enclosure.

Each row of batteries 12 rests upon its associated floor rest 16, where floor rests 16 are alternately attached to front wall 18 and rear wall 20 to provide a path for air flow, as indicated in FIG. 1. In accordance with the teachings of the present invention, cabinet 10 further includes a ventilation system 21 comprising a set of air louvers 26, a set of air exhaust louvers 30, a fan 32 and a fan controller 34. Air intake louvers 26 are formed on rear wall 20 of cabinet 10. In accordance with the present invention, fan controller 34 is turned to fan 32 (and thus ventilation system 21) "on" and "off".

In one particular embodiment, fan controller 34 includes a thermostat to monitor both the interior temperature and the outdoor temperature. Once the outdoor temperature drops below the cabinet temperature, fan 32 is turned "on" by controller 34 to as to turn "on" ventilation system 21 by drawing the cooler outside air through air intake louvers 26, through cabinet 10 and then exhaust through air exhaust louvers 30. The direction of air flow will be as indicated by the arrows in FIG. 1. The insulation aids in maintaining this reduced cabinet temperature. As the outdoor temperature rises above the cabinet temperature, controller 34 will turn fan 32 "off", allowing insulation 14 to maintain the cooler ambient temperature within cabinet 10. In an alternative embodiment, a timer may used to control the ventilation system instead of a thermostat, relying on local statistical data regarding outdoor air temperature (e.g., outdoor air may be defined as "cooler" during the time from 6 PM to 6 AM (fan 32 "on"), and warmer otherwise (fan 32 "off")). Any suitable means of controlling the ventilation system is considered to fall within the scope of the present invention.

Therefore, by maintaining the cooler temperature within cabinet 10, the life of the housed batteries will be extended. The batteries have a large thermal mass and relatively long thermal time constant. However, the time constant is smaller (that is, the batteries change temperature more quickly) when the ventilation system is "on" versus when it is "off". Therefore, the objective is to cool the batteries relatively quickly when the outside air is cooler than the batteries (e.g., at night) with the disclosed ventilation system, and prevent the cabinet from heating up when the outside air temperature rises and the sun heats the cabinet, by virtue of the included insulation.

Figure 3:
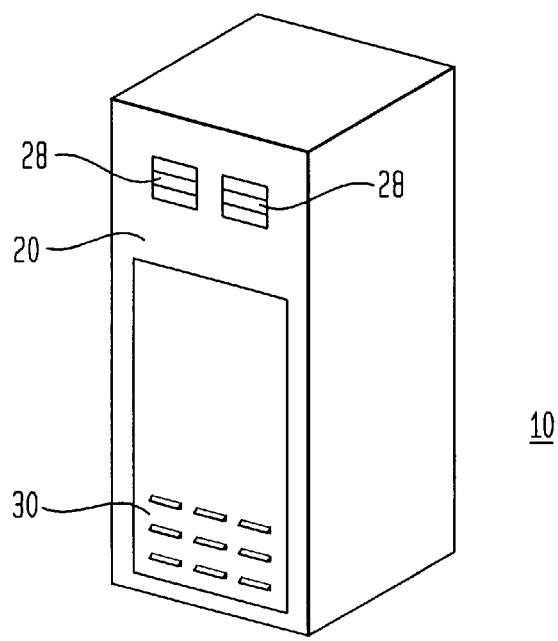
FIG. 3 is a view of the exterior of the rear of the cabinet of FIG. 1, illustrating the location of the louvers associated with the ventilation system.

FIG. 3 illustrates a rear view of cabinet 10. As shown in this view, louvers 26 associated with ventilation system 21 actually include two sets of louvers. The actual size, location and number of louvers are merely a matter of design choice. Exhaust louvers 30 are illustrated in FIG. 3 as extending across a substantial area of the lower portion of rear wall 20. Again, the location, number and size of the exhaust louvers are a matter of design choice.

Various other modifications including, for example, the type of insulation and the amount of insulation used, are considered to fall within the spirit and scope of the invention as described above and defined by the claims hereinbelow.

What is claimed is:

1. An outdoor battery cabinet including a plurality of walls having interior surfaces, the cabinet comprising
    insulation disposed to surround the interior surfaces of said walls; and
    ventilation means included within said cabinet and comprising
        an air intake unit;
        an air exhaust unit; and
        a ventilation control system, said ventilation control system responsive to both the outdoor air temperature and the air temperature within said battery cabinet, said ventilation means for turning "on" said ventilation control system and drawing outdoor air in through said air intake unit and exhausting through said air exhaust unit when the outdoor air temperature is less than the air temperature within said battery cabinet, and turning "off" said ventilation control system when the outdoor air temperature is greater than the temperature inside the cabinet.

2. An outdoor battery cabinet as defined in claim 1 wherein the air intake unit and air exhaust unit are disposed within the same cabinet wall.

3. An outdoor battery cabinet as defined in claim 2 wherein the air intake unit and air exhaust unit are disposed within a rear cabinet wall.

4. An outdoor battery cabinet as defined in claim 1 wherein the ventilation control system includes a thermostat.

5. An outdoor battery cabinet as defined in claim 1 wherein the ventilation control system includes a timer for turning "on" said ventilation control system during a predefined time period.

6. An outdoor battery cabinet as defined in claim 1 wherein the insulation is disposed to cover each interior wall surface.

* * * * *